(12) United States Patent
Inoue et al.

(10) Patent No.: US 10,304,675 B2
(45) Date of Patent: May 28, 2019

(54) SYSTEM FOR INTEGRATING PRECEDING STEPS AND SUBSEQUENT STEPS

(71) Applicant: NATIONAL INSTITUTE OF ADVANCED INDUSTRIAL SCIENCE AND TECHNOLOGY, Tokyo (JP)

(72) Inventors: Michihiro Inoue, Tsukuba (JP); Shiro Hara, Tsukuba (JP); Fumito Imura, Tsukuba (JP); Arami Saruwatari, Tosu (JP); Sommawan Khumpuang, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 7 days.

(21) Appl. No.: 15/531,237

(22) PCT Filed: Nov. 16, 2015

(86) PCT No.: PCT/JP2015/082138
§ 371 (c)(1),
(2) Date: May 26, 2017

(87) PCT Pub. No.: WO2016/084643
PCT Pub. Date: Jun. 2, 2016

(65) Prior Publication Data
US 2017/0330741 A1    Nov. 16, 2017

(30) Foreign Application Priority Data
Nov. 27, 2014  (JP) .................................. 2014-240531

(51) Int. Cl.
*H01L 21/677* (2006.01)
*H01L 21/673* (2006.01)
(Continued)

(52) U.S. Cl.
CPC .......... *H01L 21/02* (2013.01); *H01L 21/6734* (2013.01); *H01L 21/6773* (2013.01);
(Continued)

(58) Field of Classification Search
CPC ... H01L 21/67132; H01L 21/56; H01L 24/97; H01L 2223/54486; H01L 2224/32225;
(Continued)

(56) References Cited

U.S. PATENT DOCUMENTS

2002/0135966 A1* 9/2002 Tanaka ...................... G03F 1/66
                                                                    361/212
2002/0145207 A1* 10/2002 Anderson ........... H01L 21/4853
                                                                    257/787
(Continued)

FOREIGN PATENT DOCUMENTS

JP    2004-47929 A     2/2004
JP    2011-258721 A    12/2011
(Continued)

OTHER PUBLICATIONS

Jan. 12, 2016 Search Report issued in International Patent Application No. PCT/JP2015/082138.

*Primary Examiner* — Caridad Everhart
(74) *Attorney, Agent, or Firm* — Oliff PLC

(57) ABSTRACT

A semiconductor manufacturing system has a series of steps, from manufacturing of a semiconductor on a wafer until packaging, that can be easily linked. A semiconductor chip manufacturing device manufactures a semiconductor chip, and a semiconductor packaging device packages the semiconductor chip by attaching the semiconductor chip to a package substrate which is larger than the wafer. The semiconductor chip manufacturing device includes a PLAD system for loading the wafer into and out of the semiconductor chip manufacturing device through a shuttle which is (Continued)

capable of housing the wafer. The semiconductor packaging device includes a PLAD system capable of loading the package substrate into and out of the semiconductor packaging device through a shuttle which is capable of housing the package substrate. The shuttles have container bodies of a same shape.

4 Claims, 10 Drawing Sheets

(51) Int. Cl.
    *H01L 21/02*         (2006.01)
    *H01L 23/00*         (2006.01)
    *H01L 23/544*       (2006.01)

(52) U.S. Cl.
    CPC ........ *H01L 21/67736* (2013.01); *H01L 24/19* (2013.01); *H01L 24/20* (2013.01); *H01L 23/544* (2013.01); *H01L 2223/54426* (2013.01); *H01L 2223/54453* (2013.01); *H01L 2224/04105* (2013.01); *H01L 2224/12105* (2013.01); *H01L 2224/2919* (2013.01); *H01L 2224/32225* (2013.01); *H01L 2224/32245* (2013.01); *H01L 2224/73267* (2013.01); *H01L 2224/92244* (2013.01)

(58) Field of Classification Search
    CPC ......... H01L 21/67751; H01L 21/67769; H01L 21/67346; H01L 21/6773; H01L 21/67742; H01L 21/67763; H01L 21/6835; H05K 1/182; B81C 99/0025
    See application file for complete search history.

(56) References Cited

U.S. PATENT DOCUMENTS

2007/0194438 A1\*   8/2007   Takasaki ........... H01L 21/67132
                                                                  257/704
2009/0142166 A1\*   6/2009   Miyajima ......... H01L 21/67772
                                                                  414/217.1

FOREIGN PATENT DOCUMENTS

| JP | 2011-258722 A | 12/2011 |
|----|---------------|---------|
| JP | 2012-054414 A | 3/2012 |
| JP | 2012-64710 A | 3/2012 |
| JP | 2013-161964 A | 8/2013 |
| WO | 2012/029775 A1 | 3/2012 |

\* cited by examiner

FIG. 2
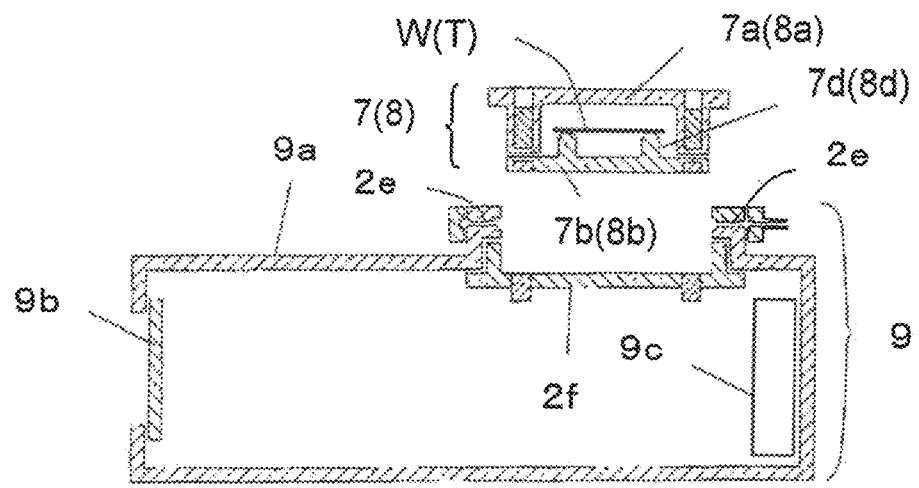
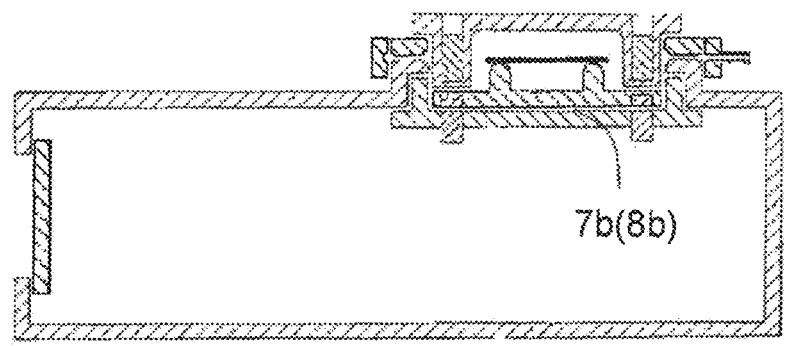
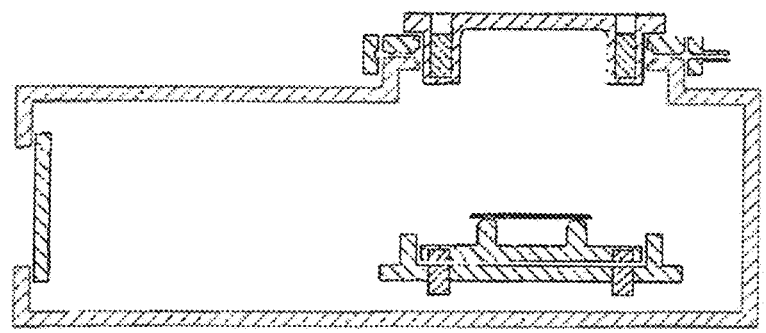

SYSTEM FOR INTEGRATING PRECEDING STEPS AND SUBSEQUENT STEPS

TECHNICAL FIELD

The present invention relates to a semiconductor manufacturing system from manufacturing of a semiconductor on a wafer until packaging.

BACKGROUND ART

In recent years, as a manufacturing line for a semiconductor device, minimal fabrication systems have been proposed in which basically one device is manufactured in a 0.5 inch size (half inch size) wafer, the manufacturing step is therefore composed of plural portable unit treatment devices, these plural unit treatment devices are easily re-arranged in flow shops and job shops, and thereby the minimal fabrication systems can properly cope with extremely small quantity production and multi-kind production (refer to Patent Literature 1 for example).

Also, with respect to the minimal fabrication system, such systems have been proposed that a connection conveyance system which is common to each of respective unit treatment devices is attached, a conveyance container containing a wafer is connected to a connection chamber of the connection conveyance system, and the wafer within the conveyance container is taken out and is conveyed into each unit treatment device in this state (refer to Patent Literatures 2-4 for example).

CITATION LIST

Patent Literatures

Patent Literature 1: International Publication WO2012/029775
Patent Literature 2: JP-A No. 2011-258721
Patent Literature 3: JP-A No. 2011-258722
Patent Literature 4: JP-A No. 2013-161964

SUMMARY OF THE INVENTION

Technical Problem

However, according to the related art disclosed in Patent Literature 1 described above, description is made only on a unit treatment device used for so-called preceding steps until manufacturing of a semiconductor on a wafer. Therefore, no consideration is made on a unit treatment device used for so-called subsequent steps until assembling a product obtained by manufacturing of the semiconductor on the wafer onto a substrate and the like and packaging. Further, according to the related arts disclosed in Patent Literatures 2 to 4 described above also, no consideration is made on the connected conveyance system used for subsequent steps after manufacturing of a semiconductor on a wafer, and linkage of these preceding steps and subsequent steps is not easy.

The present invention has been achieved in view of the circumstance in the related arts described above, and its object is to provide a semiconductor manufacturing system in which a series of steps, from manufacturing of a semiconductor on a wafer until packaging, can be easily linked.

Solution to Problem

In order to achieve the object described above, the present invention is made a semiconductor manufacturing system including a semiconductor chip manufacturing device for manufacturing a semiconductor chip in which a semiconductor is manufactured on a wafer, and a semiconductor packaging device that packages the semiconductor chip manufactured by the semiconductor chip manufacturing device by attaching the semiconductor chip to a substrate which is larger than the wafer, in which the semiconductor chip manufacturing device includes a first loading in/out mechanism that loads the wafer into and out of the semiconductor chip manufacturing device through a first conveyance container that is capable of housing the wafer, the semiconductor packaging device includes a second loading in/out mechanism that loads the substrate into and out of the semiconductor packaging device through a second conveyance container that is capable of housing the substrate, the second loading in/out mechanism having a configuration same to that of the first loading in/out mechanism, the first conveyance container includes a first container body and a first holding section that is arranged within the first container body and holds the wafer, the second conveyance container includes a second container body and a second holding section that is arranged within the second container body and holds the semiconductor chip and the substrate, and the first conveyance container and the second conveyance container have the first container body and the second container body of a same shape.

According to the present invention configured thus, the shape of the first container body of the first conveyance container and the shape of the second container body of the second conveyance container are made same, the first container body of the first conveyance container being for loading the wafer into and out of the semiconductor chip manufacturing device in the first loading in/out mechanism, the second container body of the second conveyance container being for conveying the semiconductor chip and the substrate into the semiconductor packaging device in the second loading in/out mechanism that has a configuration same to that of the first loading in/out mechanism. Therefore, the semiconductor chip in which the semiconductor is manufactured on the wafer by the semiconductor chip manufacturing device is housed in the second conveyance container, and thereby the semiconductor chip can be loaded into and out of the semiconductor packaging device by the second loading in/out mechanism through the second conveyance container. Accordingly, a series of steps, from manufacturing of the semiconductor on the wafer until packaging, can be easily linked.

Also, in order to achieve the object described above, the present invention is made a semiconductor manufacturing system in which the first conveyance container and the second conveyance container are same in the outside diameter dimension and are different only in the internal shape.

In the present invention configured thus, the first conveyance container and the second conveyance container are same in the outside diameter dimension and are different only in the internal shape. As a result, unification of the shape of the first loading in/out mechanism of the semiconductor chip manufacturing device and the second loading in/out mechanism of the semiconductor packaging device is enabled, and the first loading in/out mechanism and the second loading in/out mechanism can have a same shape. Therefore, the structure of each device required for the manufacturing line from manufacturing of the semiconductor on the wafer until packaging can be more simplified and unified.

Also, in order to achieve the object described above, the present invention is made a semiconductor manufacturing system in which the shape of the first conveyance container and the second conveyance container is different only in the shape of the first holding section and the second holding section.

In the present invention configured thus, the shape of the first conveyance container and the second conveyance container is different only in the shape of the first holding section and the second holding section. Therefore, in each of the first conveyance container that houses the wafer and the second conveyance container that houses the substrates larger than the wafer, the shape of the first conveyance container and the second conveyance container excluding the first holding section for holding the wafer and the second holding section for holding the semiconductor chip and the substrate can be unified more.

Also, in order to achieve the object described above, the present invention is made a semiconductor manufacturing system in which the wafer and the semiconductor chip are of a disk shape having 12.5 mm outside diameter, and the substrate is of a disk shape having 13.5 mm outside diameter.

In the present invention configured thus, since the wafer and the semiconductor chip are of a disk shape having 12.5 mm outside diameter and the substrate is of a disk shape having 13.5 mm outside diameter, the semiconductor chip which is used in so-called minimal fabrication system and in which the semiconductor is manufactured on the wafer can be applied to a series of steps until being attached onto the substrate larger than the semiconductor chip and being packaged.

Advantageous Effects of Invention

According to the present invention, the semiconductor chip in which the semiconductor is manufactured on the wafer by the semiconductor chip manufacturing device is housed in the second conveyance container, and thereby the semiconductor chip can be loaded into and out of the semiconductor packaging device by the second loading in/out mechanism through the second conveyance container. Accordingly, a series of steps, from manufacturing of the semiconductor on the wafer until packaging, can be easily linked.

BRIEF DESCRIPTION OF DRAWINGS

FIG. 2 is a schematic view that shows a first loading in/out mechanism and a first conveyance container of the semiconductor chip manufacturing device.

DESCRIPTION OF EMBODIMENTS

Hereinafter, embodiments of the present invention will be explained based on drawings.

Figure 1:
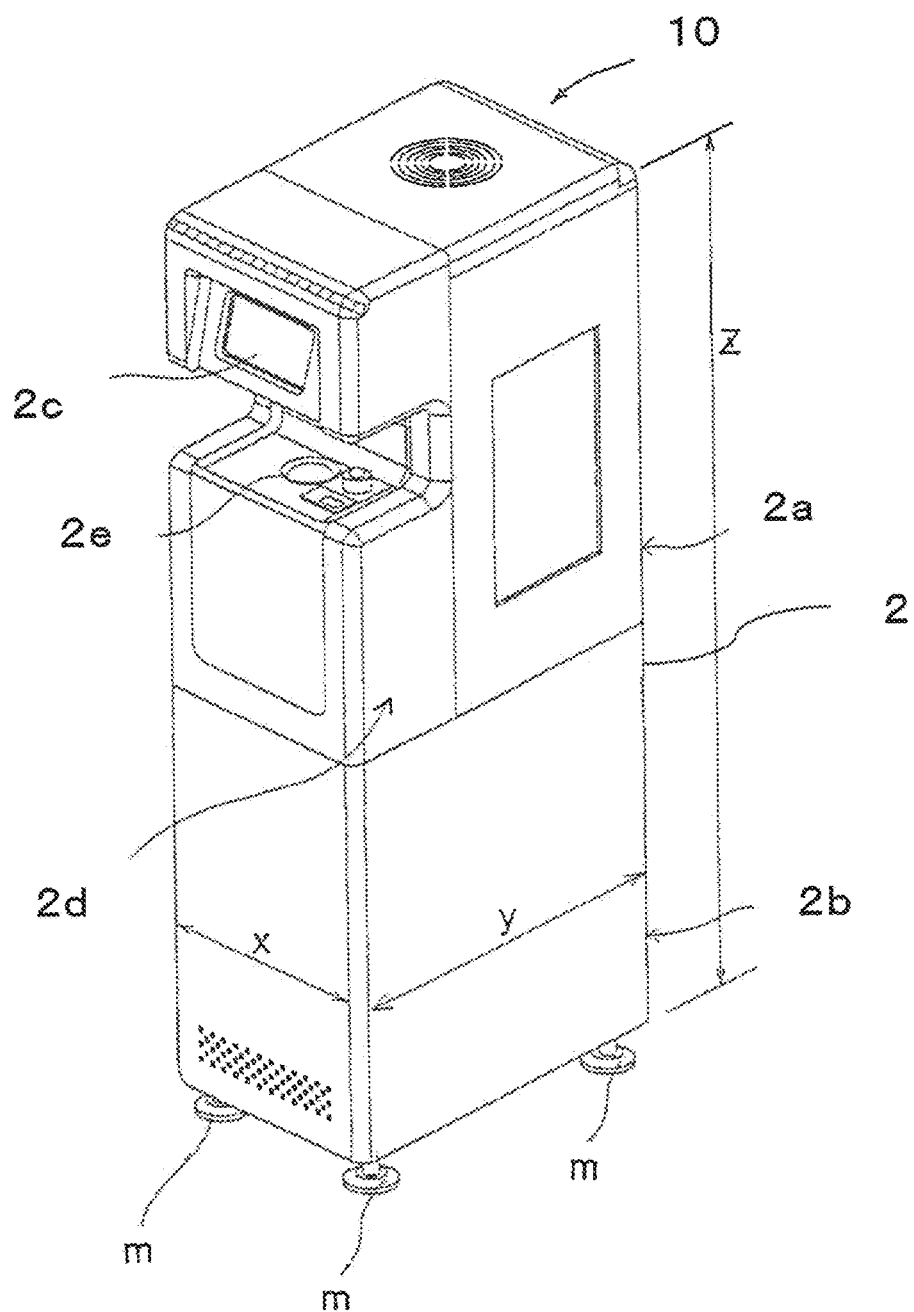
FIG. 1 is an external view of a semiconductor chip manufacturing device and a semiconductor packaging device of a semiconductor manufacturing system according to an embodiment of the present invention.
Figure 4:
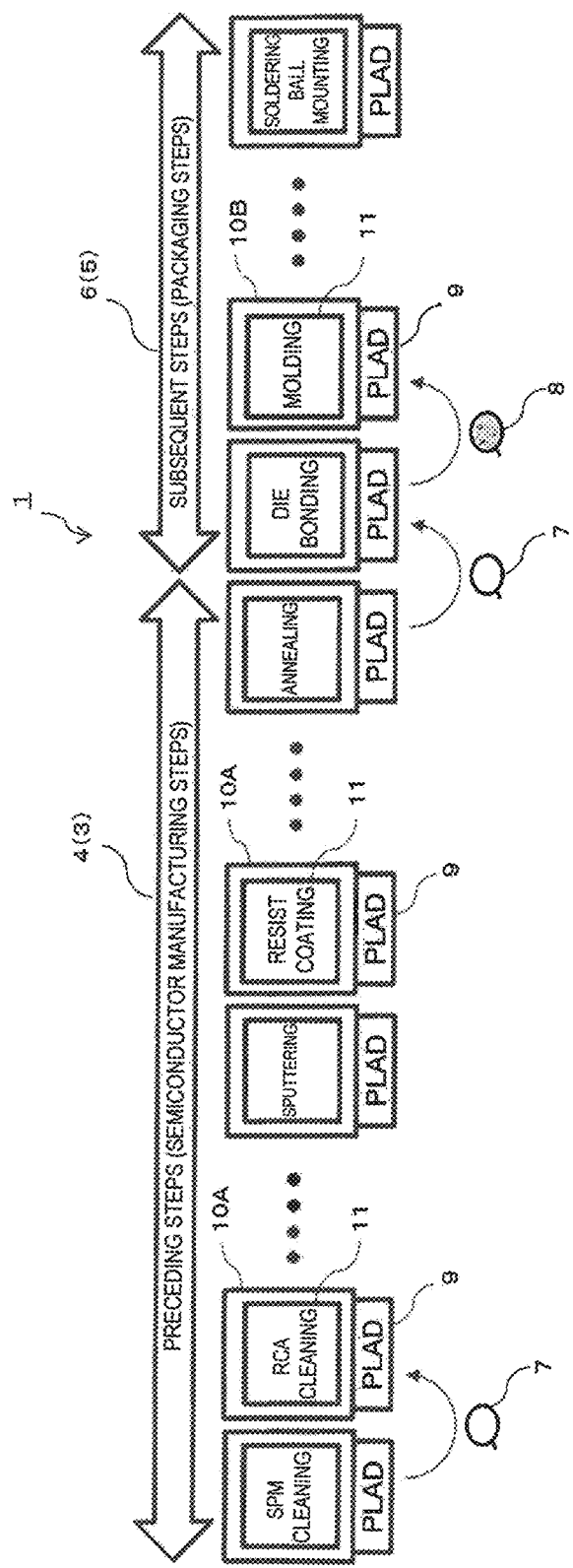
FIG. 4 is a schematic view that shows a preceding step unit treatment device configuring the semiconductor chip manufacturing device and a subsequent step unit treatment device configuring the semiconductor packaging device.

As shown in FIG. 1, a semiconductor manufacturing system 1 according to an embodiment of the present invention is configured with plural unit treatment devices 10 that are based on a concept of a minimal fabrication housed within a case 2 having a size standardized beforehand. As shown in FIG. 4, these unit treatment devices 10 are configured with a unit treatment device group 4 for preceding steps which configures a semiconductor chip manufacturing device 3 for manufacturing a semiconductor A on a wafer W, and a unit treatment device group 6 for subsequent steps which configures a semiconductor packaging device 5 that attaches a semiconductor chip C manufactured by the semiconductor chip manufacturing device 3 to a package substrate T larger than the wafer W and packages the same to produce a semiconductor package P. The minimal fabrication concept is optimum for a semiconductor manufacturing market of multi-kind and small quantity, can cope with various fabrication of resource saving, energy saving, investment saving, and high performance, and achieves a minimal production system that makes the production minimal described in JP-A No. 2012-54414 for example.

The case 2 of each unit treatment device 10 is unified to a size of 0.30 m width (x)×0.45 m depth (y)×1.44 m height (z) formed into a generally rectangular parallelepiped shape having the longitudinal direction in a vertical direction, and has a construction of blocking infiltration of each of fine particles and gas molecules to an inside. In a device upper section 2a on an upper side of the case 2, various treatment device bodies 11 for treating the wafer W are housed. The treatment device body 11 has a structure capable of effecting one treatment step required for manufacturing the semiconductor A on the wafer W such as etching, exposing and developing, and has a configuration capable of effecting one treatment step required until packaging of the semiconductor chips C to produce the semiconductor package P. On a lower side of the case 2, a device lower section 2b is arranged which is for incorporating a control device and the like that controls a treatment device body 11 within the device upper section 2a. In the device lower section 2b, various units used for treatment in the treatment device body are housed. Also, in the device lower section 2b, support sections m for supporting the case 2 are arranged.

A middle section in the vertical direction of the device upper section 2a of the case 2 has such a shape that a front face side of this device upper section 2a is cut in a shape recessed backwardly. To a front face side of an upper side of the device upper section 2a, an operation panel 2c is attached. A lower portion of the device upper section 2a is made a front chamber 2d that allows the wafer W to be conveyed into the case 2. At a generally center portion of an upper surface of the front chamber 2d, there is arranged a docking port 2e of a generally circular shape as a shuttle housing section for arranging a shuttle 7 or 8 as the conveyance containers shown in FIG. 2 to FIG. 4. In the docking port 2e, a device door 2f is arranged over which the shuttle 7 or 8 can be placed. The front chamber 2d is configured to block infiltration of each of fine particles and gas molecules into the case 2. In other words, the front chamber 2d is made a PLAD (Particle Lock Air-tight Docking) system 9 that can take the wafer W, the semiconductor chips C, the package substrates T, and the like housed within the shuttle 7 or 8 into and out of the case 2 without exposing the same to the outside air.

The PLAD system 9 includes a load lock chamber 9a as a connection chamber that is connected to the treatment device body 11, and a gate valve 9b that allows the load lock chamber 9a to open/close and communicates with the treatment device body 11. In the load lock chamber 9a, a conveyance device 9c is housed which becomes a loading in/out mechanism for conveying the wafer W and the like loaded in from the docking port 2e to a predetermined position within the treatment device body 11 and loading out the wafer W and the like after having been treated by the treatment device body 11 to the docking port 2e. As the conveyance device 9c, a work conveyance device described in JP-A No. 2011-96942 for example and so on are used. Here, the PLAD system 9 has a construction and shape common to all of the unit treatment devices 10 that are adapted to the minimal fabrication concept.

<Unit Treatment Device Group for Preceding Steps>

The unit treatment device group 4 for preceding steps is configured with plural unit treatment devices 10 until manufacturing of the semiconductor A on the surface of the wafer W of a predetermined size standardized in the minimal fabrication concept to produce the semiconductor chip C, and is configured with plural unit treatment devices 10A having different treatment steps according to the kind of the semiconductor A manufactured on the surface of the wafer W, and so on. The wafer W treated by these unit treatment devices 10A has a flat surface of a circular shape with 12.5 mm (half inch size: 0.5 inch) diameter for example, and is an n-type Si substrate for example having a disk shape with 0.25 mm thickness formed of mono-crystal silicon (Si). Each wafer W is housed one sheet each within the shuttle 7 that is the first conveyance container for conveying the wafer, the treatment of each unit treatment device 10A is started by fitting the shuttle 7 to the docking port 2e of each unit treatment device 10A, thereby the wafer W housed within this shuttle 7 is taken out from the inside of the shuttle 7 and is loaded in to a predetermined position within the treatment device body 11 by the conveyance device 9c, and the wafer W after having been treated by each treatment device body 11 is loaded out to the inside of the shuttle 7 by the conveyance device 9c. Also, the wafer W is conveyed to the unit treatment device 10A of the next step according to a recipe for the semiconductor A that is manufactured on the surface. Further, the PLAD system 9 of each unit treatment device 10A includes the conveyance device 9c that is the first loading in/out mechanism for loading the wafer W into and out of the treatment device body 11 of each unit treatment device 10A, and these conveyance devices 9c have same shape and configuration.

<Shuttle for Preceding Steps>

The shuttle 7 used for each unit treatment device 10A for preceding steps includes a container body 7a as the first container body, a lower portion of the container body 7a opens, and a container door 7b of a disk shape is arranged. The container body 7a and the container door 7b are securely attached to each other by a magnetic force and the like, and the space within the shuttle 7 is blocked from an outside air. The shuttle 7 is used in a state where the container door 7b is directed downward with this container door 7b being placed over the device door 2f of the docking port 2e. At this time, it is configured that the shuttle 7 can be precisely placed over the docking port 2e by arranging a pin for positioning in one of the container door 7b and the device door 2f and arranging in the other a hole to which the pin for positioning is fitted, and so on. The container body 7a and the container door 7b of the shuttle 7 are hermetically sealed through an O ring (not illustrated) of a ring shape as a seal member.

Figure 3:
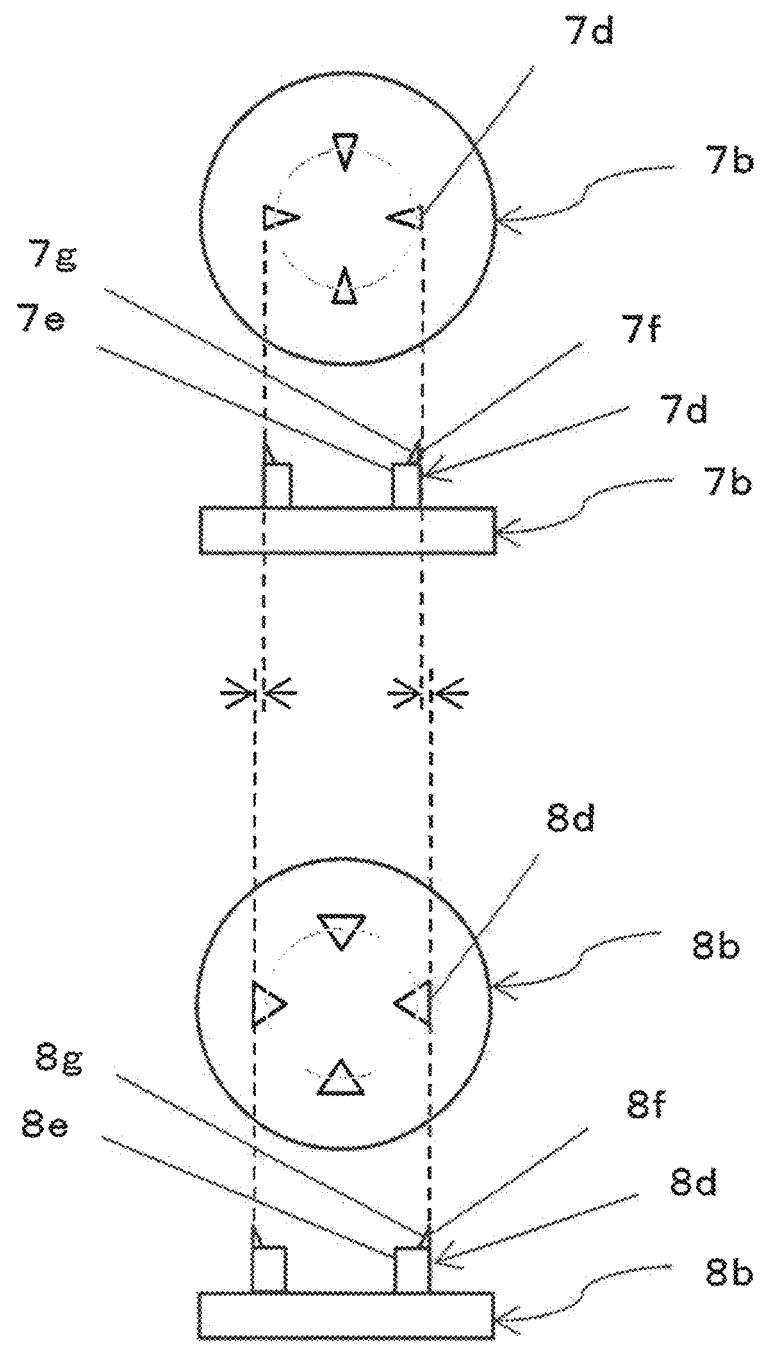
FIG. 3 is a schematic view that shows a first conveyance container door of the first conveyance container and a first conveyance container door of a second conveyance container, the second conveyance container being used for the semiconductor packaging device.

As shown in FIG. 3, on an inside surface that is positioned on a side fitted toward an inside of the container body 7a of the container door 7b of the shuttle 7, plural (4 for example) first holding sections 7d of a claw shape for holding the wafer W are formed. These four holding sections 7d are arranged apart at equal intervals in a peripheral direction around a center of an inside surface of the container door 7b so as to be capable of holding an outer peripheral edge of the wafer W at equal intervals. Each holding section 7d includes a holding section body 7e of an isosceles triangle shape in a plan view. At a bottom side portion of each of these holding section bodies 7e, a first locking piece section 7f for locking the outer peripheral edge of the wafer W is arranged. Each holding section body 7e is attached so as to direct a vertex side of each of these holding section bodies 7e toward the center position of the inside surface of the container door 7b. On the inner side of each locking piece section 7f, a locking surface 7g of a tapered shape is arranged, and the locking surface 7g is for accurately determining the position for holding the wafer W by each of these locking piece sections 7f.

<Unit Treatment Device Group for Subsequent Steps>

The unit treatment device group 6 for subsequent steps is configured with plural unit treatment devices 10B until packaging of the semiconductor chip C manufactured by the unit treatment device group 4 for preceding steps to produce the semiconductor package P, and is configured with plural unit treatment devices 10B having different treatment steps according to the kind of the semiconductor chip C, the kind of the package, and so on. Packaging by these unit treatment devices 10B is executed by attaching the semiconductor chip C onto the package substrate T of a disk shape with 13.5 mm outside diameter for example. Each package substrate T is housed one sheet each within the shuttle 8 for subsequent steps which is for conveying the package substrate T and the semiconductor chip C to which the package substrate T has been attached, the shuttle 8 is fitted to the docking port 2e of each unit treatment device 10B for subsequent steps to start the treatment of each unit treatment device 10B, thereby the package substrate T housed within this shuttle 8 is taken out from the inside of the shuttle 8 and is loaded in to a predetermined position within the treatment device body 11 by the conveyance device 9c, and the package substrate T after being treated by each treatment device body 11 is loaded out to the inside of the shuttle 8 by the conveyance device 9c. Also, the semiconductor chip C and the package substrate T are conveyed to the unit treatment device 10B of the next step according to a recipe for a duration until packaging the semiconductor chip C and producing the semiconductor package P.

Further, with respect to each unit treatment device 10B for subsequent steps, although the treatment device body 11 differs according to its treatment, other case 2, operation panel 2c, docking port 2e, PLAD system 9, and the like have a configuration same to that of the unit treatment device 10A for preceding steps.

<Shuttle for Subsequent Steps>

The shuttle 8 used for each unit treatment device 10 for subsequent steps and for conveying the package substrate T includes a container body 8a as a second container body, a container door 8b, and an O ring (not illustrated), and for example four second holding sections 8d, has a shape different only in the shape of each holding section 8d and has a shape same in the container body 8a, the container door 8b excluding the holding section 8d, and the O ring compared to the shuttle 7 for conveying the wafer as shown in FIG. 3. In other words, the shuttle 7 for preceding steps and the shuttle 8 for subsequent steps are same in the outline dimensions, and are different only in the internal shape. Each holding section 8d includes a holding section body 8e whose length dimension of the bottom side portion is made longer so that the outer peripheral edge of the package substrate T whose outside dimension is larger than that of the wafer W by approximately 1 mm can be held at equal intervals, and a second locking piece section 8f is arranged in the bottom side portion of each of these holding section bodies 8e. Each holding section body 8e is shaped similarly to the holding section body 7e of the shuttle 7 for preceding steps, namely in a similar shape, and a locking surface 8g of a tapered shape is arranged on the inner side of each locking piece section 8f. The locking surface 8g of each of these locking piece sections 8f is formed to have an inclination angle having a larger bottom side so as to be capable of accurately holding not only the package substrate T but also the wafer W namely the semiconductor chip C of a disk shape with 12.5 mm outside diameter.

<Manufacturing of Semiconductor Chip in Preceding Steps>

Next, the method for manufacturing the semiconductor chip C by the unit treatment device group 4 for preceding steps will be explained referring to FIG. 4 and FIG. 5.

(Initial Cleaning of Wafer)

First, as shown in FIG. 4, after the wafer W is subjected to SPM cleaning using a predetermined unit treatment device 10A among the unit treatment device group 4 for preceding steps, the wafer W is subjected to RCA cleaning by another unit treatment device 10A arranged adjacent to the unit treatment device 10A.

At this time, the wafer W is fitted to the docking port 2e of the predetermined unit treatment device 10A to be positioned and held in a state of being housed within the shuttle 7 for preceding steps. In this state, treatment by this unit treatment device 10A is started, thereby the container door 7b is detached from the container body 7a of the shuttle 7, and is loaded in to the inside of the load lock chamber 9a of the PLAD system 9. Thereafter, the wafer W held by the holding section 8d of the container door 7b is conveyed to a predetermined position of the treatment device body 11 by the conveyance device 9c of the PLAD system 9. Also, after execution of a predetermined treatment by this unit treatment device 10A, the wafer W arranged at the predetermined position of the treatment device body 11 is conveyed by the conveyance device 9c to the holding section 7d of the container door 7b of the shuttle 7 through the load lock chamber 9a, and is held at a predetermined position on the container door 7b by this holding section 7d. Thereafter, the container door 7b holding the wafer W is attached to the container body 7a that is fitted to the docking port 2e, and comes to a state that the airtight state is maintained. Also, by detaching the shuttle 7 from the docking port 2e, the wafer W having been subjected to the predetermined treatment can be taken out from the unit treatment device 10A in a state of being housed in the shuttle 7. Further, this shuttle 7 is fitted to the docking port 2e of the unit treatment device 10A of the next step, and the next step by this unit treatment device 10A is executed.

(Formation of Alignment Mark)

Figure 5:
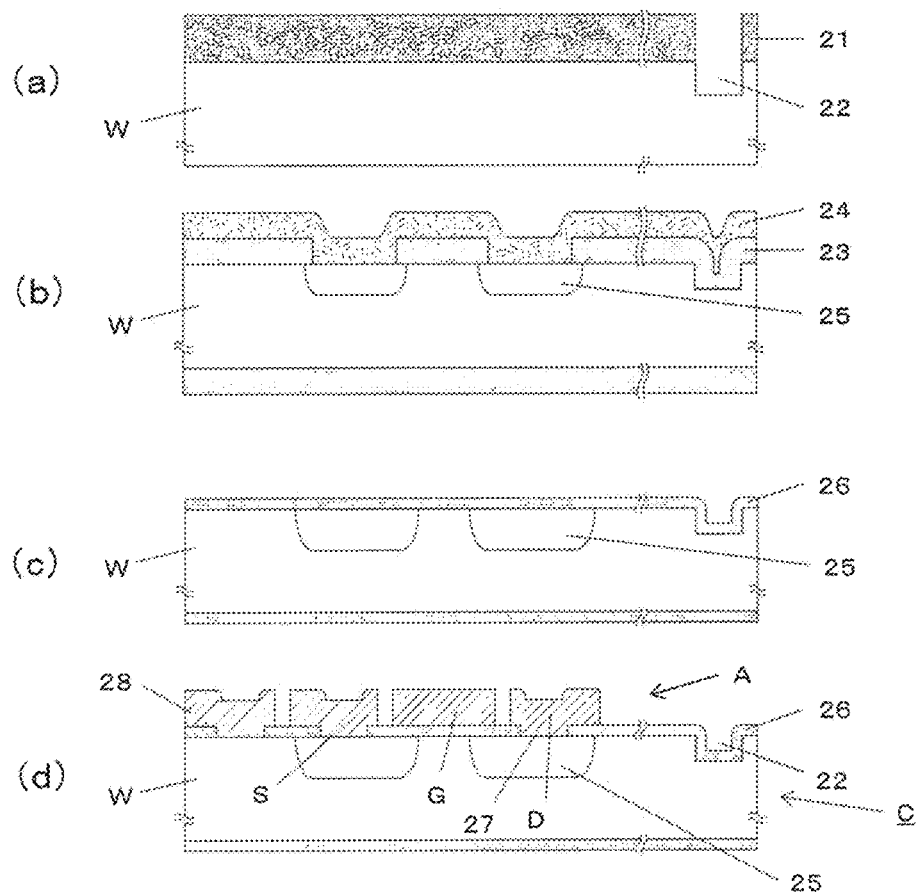
FIG. 5 is a process drawing that shows the manufacturing steps of a semiconductor chip by the semiconductor chip manufacturing device, wherein (a) shows formation of an alignment mark, (b) shows formation of source/drain, (c) shows formation of a gate oxide film, and (d) shows formation an electrode.

Further, the wafer W having been subjected to RCA cleaning is coated with a resist liquid for dry etching at its surface, is thereafter exposed, is then developed, a photoresist 21 is formed on the surface of this wafer W, patterning is executed, Si dry etching is thereafter executed, and an alignment mark 22 shown in FIG. 5 (a) is formed on the surface of the wafer W. Thereafter, the photoresist 21 on this wafer W is removed.

(Formation of Source/Drain Impurities Diffusion Region)

The wafer W formed with the alignment mark 22 is cleaned, and is thereafter subjected to dry oxidation. Thereafter, the surface of the wafer W is coated with the resist liquid for wet etching, is thereafter exposed, and is then developed, a predetermined pattern is formed on the surface of this wafer W, thermal oxide film wet etching is thereafter executed, and an $SiO_2$ layer 23 is formed. Then, after removing the resist on the wafer W, cleaning is executed, and an impurities diffusion agent 24 is thereafter coated. Also, the wafer W coated with the impurities diffusion agent 24 is subjected to heat treatment to execute impurities diffusion, a diffusion region $p^+$ 25 is formed as shown in FIG. 5 (b), and wet etching is thereafter executed to remove the impurities diffusion agent 24.

(Formation of Gate Oxide Film)

Next, the wafer W formed with the source/drain impurities diffusion region is cleaned and is thereafter subjected to dry oxidation, and a gate oxide film 26 formed of $SiO_2$ is formed on the surface of the wafer W as shown in FIG. 5 (c).

(Formation of Gate, Source/Drain Contact)

The surface of the wafer W formed with the gate oxide film 26 is coated with the resist liquid for wet etching, is thereafter exposed, is then developed, a resist pattern is formed on the surface of the wafer W, and thermal oxide film wet etching is thereafter executed. Thereafter, the resist on the wafer W is removed, and a gate and a contact hole 27 between the source or the drain are formed.

(Formation of Al Electrode)

The wafer W formed with the contact hole 27 is cleaned, is thereafter subjected to sputtering using aluminum (Al) to form an Al layer 28 on its surface, is thereafter coated with the resist liquid for wet etching, is thereafter exposed, is then developed, and a predetermined resist pattern is formed on the surface of this Al layer on the wafer W. Next, Al wet etching is executed, a gate electrode G, a source electrode S, and a drain electrode D are formed as shown in FIG. 5 (d), and the resist on the wafer W is thereafter removed by $O_2$ plasma asking. Thereafter, the wafer W formed with these gate electrode G, source electrode S, and drain electrode D is subjected to $H_2$ sintering by baking treatment with $H_2$, and thereby the semiconductor chip C with half inch size outside diameter in which the semiconductor A are manufactured on the wafer W is produced.

<Manufacturing of Semiconductor Package in Subsequent Steps>

Next, a manufacturing method (process flow) for a semiconductor package P by the unit treatment device group 6 for subsequent steps will be explained referring to FIG. 4 and FIG. 6 to FIG. 9.

(Die Attaching: Die Bonding)

Figure 6:
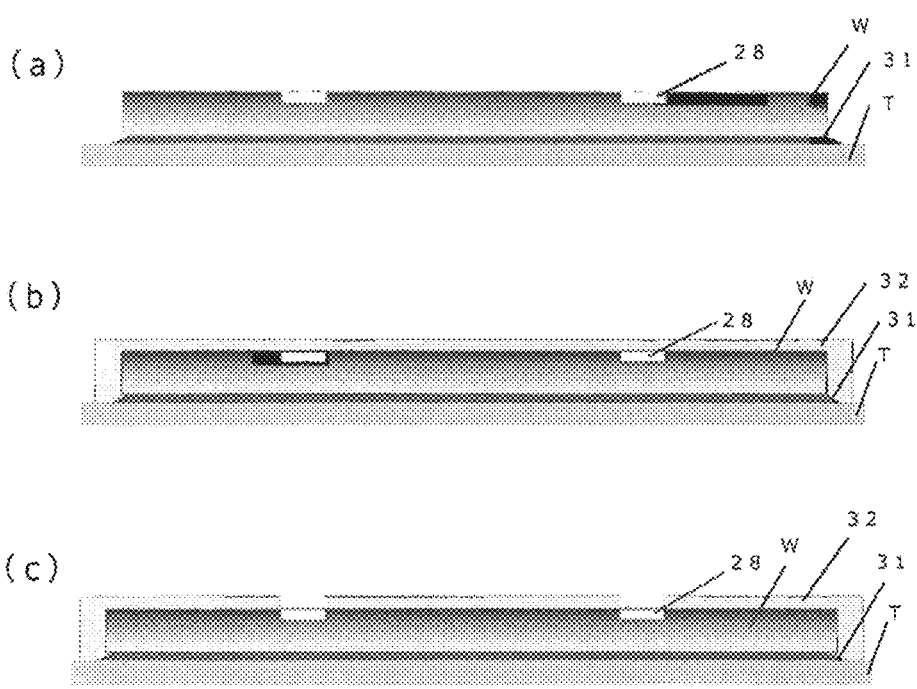
FIG. 6 is a process drawing that shows the manufacturing steps of a semiconductor package by the semiconductor packaging device, wherein (a) shows die attaching, (b) shows formation of a compression mold, and (c) shows a laser via.

First, an adhesive agent 31 is coated on the package substrate T made of an iron nickel alloy (42 alloy) of a disk shape with 13.5 mm outside diameter and 0.2 mm thickness as shown in FIG. 6 (*a*) using a predetermined unit treatment device 10B among the unit treatment device group 6 for subsequent steps as shown in FIG. 4. Next, the semiconductor chip C manufactured by the unit treatment device group 4 for preceding steps is mounted on the adhesive agent 31, and the adhesive agent 31 is thereafter hardened.

At this time, the semiconductor chip C is fitted to the docking port 2*e* of the unit treatment device 10B for a predetermined subsequent step in a state of being housed within the shuttle 7 for preceding steps. By starting the treatment by this unit treatment device 10B in this state, the semiconductor chip C is taken out from the inside of the shuttle 7 and is conveyed to a predetermined position of the treatment device body 11 of this unit treatment device 10B. Thereafter, the shuttle 8 for subsequent steps having housed the package substrate T is fitted to the docking port 2*e* of this unit treatment device 10B, the treatment by this unit treatment device 10B is started, the package substrate T is thereby taken out from the inside of the shuttle 8, and the package substrate T is conveyed to the predetermined position of the treatment device body 11 of the unit treatment device 10B to which the semiconductor chip C has been already conveyed.

Also, in this unit treatment device 10B, the package substrate T to which the semiconductor chip C has been adhered on its surface is loaded out by the PLAD system 9 from this predetermined position of the treatment device body 11 of the unit treatment device 10B, and is housed in the inside of the shuttle 8 that has been fitted to the docking port 2*e*. Thereafter, after the shuttle 8 is detached from the docking port 2*e* of this unit treatment device 10B, the shuttle 8 is fitted to the docking port 2*e* of the unit treatment device 10B of the next step. Also, in the subsequent steps thereafter, the package substrate T after having been treated by each unit treatment device 10B is transferred to the unit treatment device 10B of the next step using the shuttle 8 for subsequent steps.

(Formation of Compression Mold)

After a mold resin is coated on the surface of the semiconductor chip C so as to surround the semiconductor chip C adhered onto the package substrate T, the mold resin is hardened, and a mold resin layer 32 with 12.8 mm outside diameter and 0.1 mm thickness is formed as shown in FIG. 6 (*b*).

(Laser Via)

Also, laser abrasion for the surface of the semiconductor chip C formed with the mold resin layer 32 is executed to subject the mold resin layer 32 to patterning, and a part of the Al layer 28 of the surface of the semiconductor chip C is exposed as shown in FIG. 6 (*c*).

(Desmear Treatment)

Figure 7:
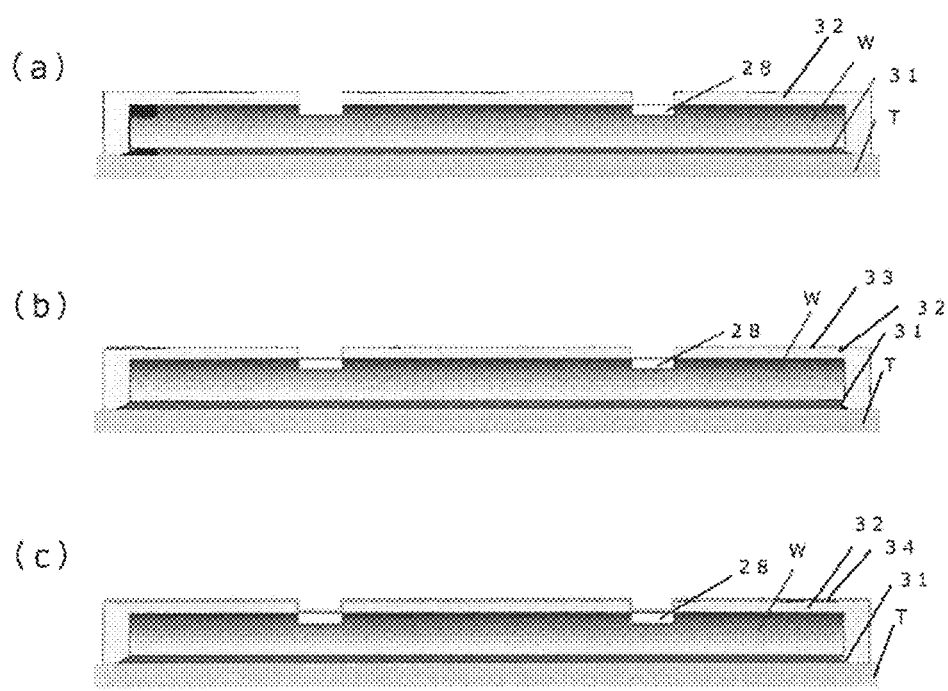
FIG. 7 is a process drawing that shows the manufacturing steps of a semiconductor package by the semiconductor packaging device, wherein (a) shows a desmear treatment, (b) shows formation of a Cu plating seed layer, and (c) shows Cu electrolytic plating.

Next, as shown in FIG. 7 (*a*), the surface of the semiconductor chip C in which a part of the Al layer 28 has been exposed is subjected to CCP dry etching, and plasma cleaning (desmear working) is executed.

(Formation of Copper Plating Seed Layer)

Thereafter, the surface of the semiconductor chip C having been subjected to the desmear treatment is subjected to sputtering with copper (Cu), and a Cu sputter film 33 with 0.1 μm thickness covering the entire surface of the semiconductor chip C is formed as shown in FIG. 7 (*b*).

(Copper Electrolytic Plating)

Further, the surface of the semiconductor chip C formed with the Cu sputter film 33 is subjected to Cu electrolytic plating, and a Cu plating film 34 with 3 μm thickness is formed on the surface of the semiconductor chip C as shown in FIG. 7 (*c*).

(Resist Coating, Exposing, Developing)

Figure 8:
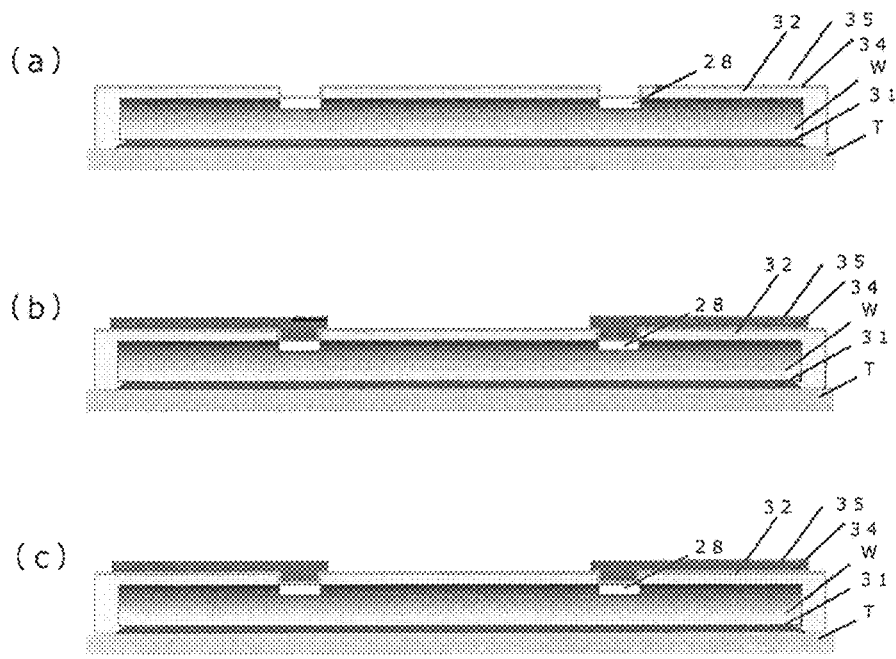
FIG. 8 is a process drawing that shows the manufacturing steps of a semiconductor package by the semiconductor packaging device, wherein (a) shows resist coating, (b) shows exposing, and (c) shows developing.
Figure 9:
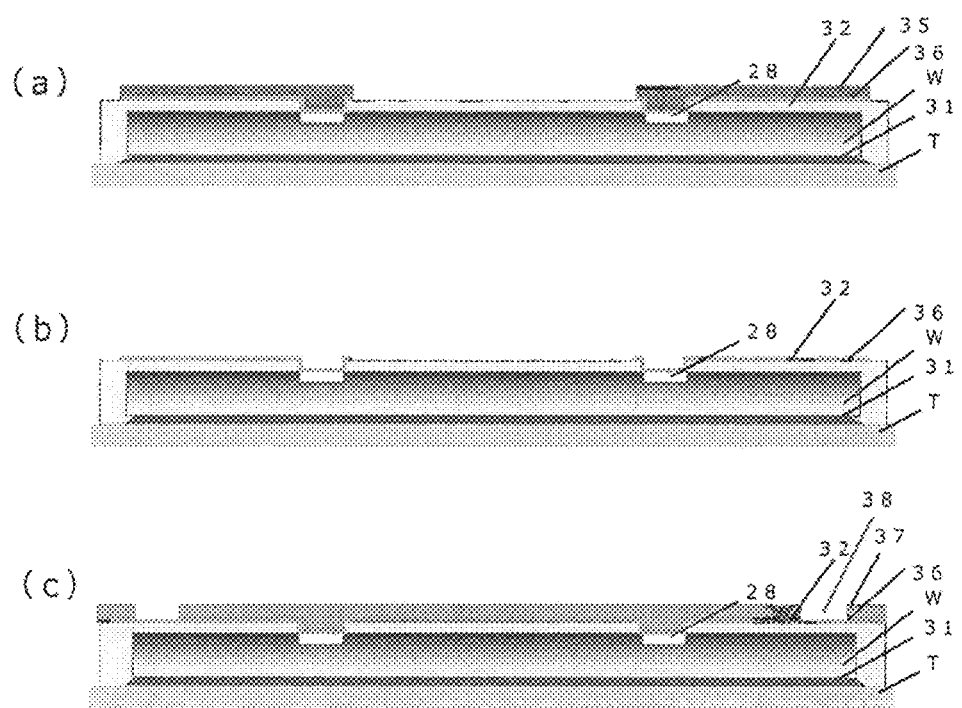
FIG. 9 is a process drawing that shows the manufacturing steps of a semiconductor package by the semiconductor packaging device, wherein (a) shows Cu etching, (b) shows resist removing, and (c) shows solder resist coating.

The surface of the semiconductor chip C formed with the Cu plating film 34 is coated with a resist liquid for a photoresist, and a resist film 35 with 1.0 μm thickness is formed as shown in FIG. 8 (*a*). Next, the semiconductor chip C formed with the resist film 35 is subjected to deep focus DLP exposing, is thereafter developed as shown in FIG. 8 (*b*), is formed with a predetermined resist pattern on the surface thereof as shown in FIG. 8 (*c*), and is thereafter subjected to Cu etching to pattern the Cu plating film 34 to form an electrode layer 36 as shown in FIG. 9 (*a*). Thereafter, the surface of the semiconductor chip C where the Cu plating film 34 is patterned is subjected to CCP dry etching, and the resist film 35 is removed as shown in FIG. 9 (*b*).

(Coating of Solder Resist)

Further, a solder resist layer 37 with 30 μm thickness is printed in a predetermined pattern by an inkjet printer on the surface of the semiconductor chip C formed with the electrode layer 36 and is thereafter ultraviolet (UV)-hardened, and contact holes 38 communicating with the electrode layer 36 are formed in the solder resist layer 37 as shown in FIG. 9 (*c*).

(Mounting of Soldering Ball: Ball Mount)

Figure 10:
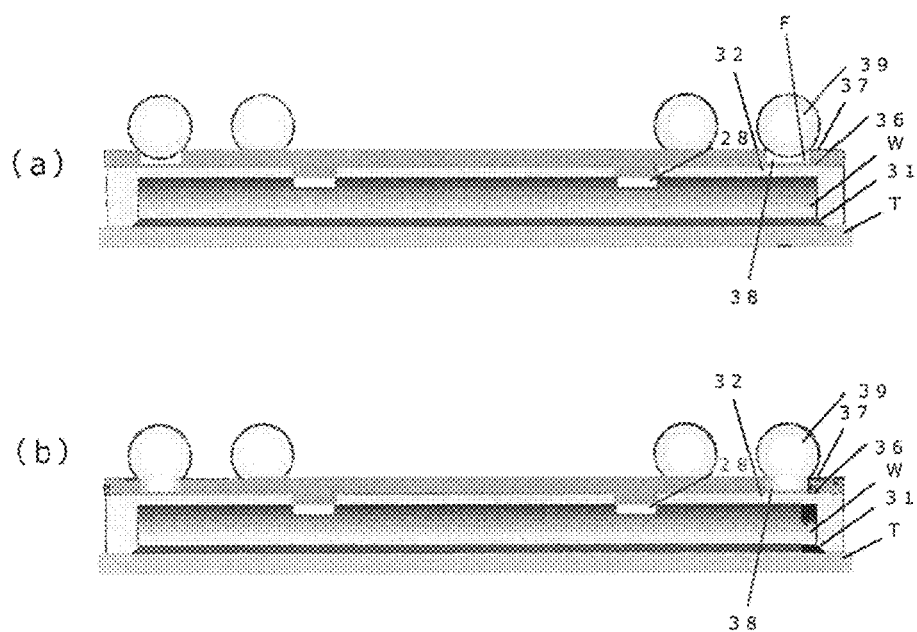
FIG. 10 is a process drawing that shows the manufacturing steps of a semiconductor package by the semiconductor packaging device, wherein (a) shows mounting of soldering balls, and (b) shows a heat treatment.

Thereafter, after the surface of the semiconductor chip C is coated with flux F, soldering balls 39 with 0.4 mm diameter are mounted on respective contact holes 38 of the solder resist layer 37 of the surface of the semiconductor chip C as shown in FIG. 10 (*a*), heat treatment is thereafter executed, a part of each soldering ball 39 is molten and is electrically connected to the electrode layer 36 on the semiconductor chip C as shown in FIG. 10 (*b*), and thereby the BGA type semiconductor chip C of a die attaching method is produced in which the semiconductor chip C of half inch size outside diameter is packaged on the package substrate T with 13.5 mm outside diameter.

[Action and Effect]

As described above, in the semiconductor manufacturing system 1 according to the embodiment, the semiconductor chip manufacturing device 3 executing the preceding steps until manufacturing of the semiconductor A on the wafer W with 12.5 mm outside diameter adapted to the minimal fabrication concept to produce the semiconductor chip C is configured with plural unit treatment devices 10A that are different only in the treatment device body 11 according to each treatment, and the PLAD systems 9 for loading the wafer W into and out of the treatment device body 11 within these unit treatment devices 10A are made common. Further, it is configured that, by fitting the shuttle 7 capable of housing the wafer W to the docking port 2*e* of the PLAD system 9 of each unit treatment device 10A, the wafer W housed within the shuttle 7 can be loaded into and out of the predetermined position of each treatment device body 11 from the inside of the shuttle 7 without being exposed to the outside air.

In addition, in a similar manner, the semiconductor packaging device 5 that executes the subsequent steps until attaching of the semiconductor chip C onto the package substrate T to produce the semiconductor package P is also configured with plural unit treatment devices 10B that are different only in the treatment device body 11 according to each treatment, and the PLAD system 9 within these unit treatment devices 10B is made common to the PLAD system 9 of the semiconductor chip manufacturing device 3. Further, it is configured that, the outline diameter of the package substrate T used in packaging the wafer W is made 13.5 mm diameter that is larger than that of the wafer W by approximately 1.0 mm, only the internal shape of the shuttle 8 that houses this package substrate T is changed, and this shuttle 8 can be fitted to the docking port 2e of each unit treatment device 10B of the subsequent steps and can be loaded into and out of the predetermined position of the treatment device body 11 from the inside of the shuttle 8 using the PLAD system 9 of each unit treatment device 10B.

In other words, it is configured that the shape of the shuttle 7 for conveying the wafer W for preceding steps and the shape of the shuttle 8 for conveying the package substrate T for subsequent steps are same with respect to the container body 7a, 8a, and are different only with respect to the holding section 7d, 8d for holding the wafer W or the package substrate T. As a result, the semiconductor chip C manufactured by the semiconductor chip manufacturing device 3 can be loaded into and out of the treatment device body 11 of the unit treatment device 10B for subsequent steps in a state of being housed in the shuttle 7. Further, the semiconductor chip C attached to the package substrate T also can be loaded into and out of the treatment device body 11 of the unit treatment device 10B for subsequent steps through the PLAD system 9 by being housed in the shuttle 8 for subsequent steps. Therefore, by using plural unit treatment devices 10A, 10B adapted to the minimal fabrication concept so as to be adapted to the recipe until producing of the semiconductor package P while using the shuttles 7, 8 having a generally same shape, a series of steps from the preceding steps to the subsequent steps until manufacturing of the semiconductor A on the wafer W and packaging the same can be easily linked. Accordingly, a minimal consecutive line from the preceding steps to the subsequent steps based on the minimal fabrication concept can be achieved.

Particularly, with respect to the shuttle 7 for preceding steps and the shuttle 8 for subsequent steps, the shape of the holding section 7d for holding the wafer W and the holding section 8d for holding the package substrate T is made a similar shape corresponding to the dimension of the object to be held namely the wafer W or the package substrate T, and the locking piece sections 7f, 8f of these holding sections 7d, 8d are of a shape only the inclination angle and the like of the locking surface 7g, 8g is adjusted so as to be different. As a result, with respect to the shape of others excluding these holding sections 7d, 8d, the shape of the shuttles 7, 8, particularly the outline shape can be made same, the shape of these shuttles 7, 8 can be unified, and therefore the shuttles 7, 8 can be fitted to the docking port 2e of each unit treatment device 10A, 10B for preceding steps and subsequent steps and can be loaded into and out of the predetermined position of the treatment device body 11 of each unit treatment device 10A, 10B. Therefore, a series of steps from the preceding steps to the subsequent steps can be executed by plural unit treatment devices 10A, 10B mounting the same PLAD system 9, and the structure of each unit treatment device 10A, 10B required for the manufacturing line after manufacturing of the semiconductor A on the wafer W until packaging can be more simplified and unified.

<Others>

Also, according to the embodiment, the semiconductor manufacturing system 1 is implemented which uses the wafer W with the half inch size (12.5 mm outside diameter) adapted to the minimal fabrication concept, and the package substrate T with 13.5 mm outside diameter where this wafer W is arranged. However, the present invention is not limited to it, and can be also used for and adapted to a semiconductor manufacturing system using a wafer of one inch or using a package substrate with the dimension other than 13.5 mm outside diameter for example. Further, the semiconductor chip C of the half inch size can be also used for and adapted to not only the BGA type semiconductor package P of the die attaching method in which the semiconductor chip C is packaged on the package substrate T with 13.5 mm outside diameter but also a semiconductor package of other packaging structure such as the BGA type of the flip chip method for example.

REFERENCE SIGNS LIST

1 Semiconductor manufacturing system
2 Case
2a Device upper section
2b Device lower section
2c Operation panel
2d Front chamber
2e Docking port
2f Device door
3 Semiconductor chip manufacturing device
4 Unit treatment device group (preceding steps)
5 Semiconductor packaging device
6 Unit treatment device group (subsequent steps)
7 Shuttle (first conveyance container/for preceding steps)
7a Container body (first container body)
7b Container door
7d Holding section (first holding section)
7e Holding section body
7f Locking piece section (first locking piece section)
7g Locking surface
8 Shuttle (second conveyance container/for preceding steps)
8a Container body (second container body)
8b Container door
8d Holding section (second holding section)
8e Holding section body
8f Locking piece section (second locking piece section)
8g Locking surface
9 PLAD system (first loading in/out mechanism, second loading in/out mechanism)
9a Load lock chamber
9b Gate valve
9c Conveyance device
10 Unit treatment device
10A Unit treatment device (for preceding steps)
10B Unit treatment device (for subsequent steps)
11 Treatment device body
21 Photoresist
22 Alignment mark
23 $SiO_2$ layer
24 Impurities diffusion agent
25 Diffusion region $p^+$ 26 Gate oxide film
27 Contact hole
28 Al layer
31 Adhesive agent
32 Mold resin layer
33 Cu sputter film
34 Cu plating film
35 Resist film
36 Electrode layer
37 Solder resist layer
38 Contact hole
39 Soldering ball
W Wafer
A Semiconductor
C Semiconductor chip
T Package substrate (substrate)
P Semiconductor package
m Support section
G Gate electrode
S Source electrode
D Drain electrode
F Flux

The invention claimed is:

1. A semiconductor manufacturing system, comprising:
a semiconductor chip manufacturing device for manufacturing a semiconductor chip in which a semiconductor is manufactured on a wafer; and
a semiconductor packaging device that packages the semiconductor chip manufactured by the semiconductor chip manufacturing device by attaching the semiconductor chip to a substrate which is larger than the wafer,
wherein the semiconductor chip manufacturing device includes a first loading in/out mechanism that loads the wafer into and out of the semiconductor chip manufacturing device through a first conveyance container that is capable of housing the wafer,
the semiconductor packaging device includes a second loading in/out mechanism that loads the substrate into and out of the semiconductor packaging device through a second conveyance container that is capable of housing the substrate, the second loading in/out mechanism having a configuration same to that of the first loading in/out mechanism,
the first conveyance container includes a first container body and a first holding section that is arranged within the first container body and holds the wafer,
the second conveyance container includes a second container body and a second holding section that is arranged within the second container body and holds the semiconductor chip and the substrate,
the first conveyance container and the second conveyance container have the first container body and the second container body of a same shape, and
the first conveyance container and the second conveyance container are same in the outside diameter dimension and are different only in the internal shape.

2. The semiconductor manufacturing system according to claim 1, wherein
the wafer and the semiconductor chip are of a disk shape having 12.5 mm outside diameter, and the substrate is of a disk shape having 13.5 mm outside diameter.

3. The semiconductor manufacturing system according to claim 1, wherein
the shape of the first conveyance container and the second conveyance container is different only in the shape of the first holding section and the second holding section.

4. The semiconductor manufacturing system according to claim 3, wherein
the wafer and the semiconductor chip are of a disk shape having 12.5 mm outside diameter, and the substrate is of a disk shape having 13.5 mm outside diameter.

* * * * *